(12) United States Patent
Maeda et al.

(10) Patent No.: US 9,224,871 B2
(45) Date of Patent: Dec. 29, 2015

(54) THIN FILM TRANSISTOR AND METHOD FOR MANUFACTURING SAME

(71) Applicant: Kabushiki Kaisha Toshiba, Minato-ku (JP)

(72) Inventors: Yuya Maeda, Kawasaki (JP); Hajime Yamaguchi, Kawasaki (JP); Tomomasa Ueda, Yokohama (JP); Kentaro Miura, Kawasaki (JP); Shintaro Nakano, Kawasaki (JP); Nobuyoshi Saito, Oota (JP); Tatsunori Sakano, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/466,314

(22) Filed: Aug. 22, 2014

(65) Prior Publication Data
US 2015/0084042 A1 Mar. 26, 2015

(30) Foreign Application Priority Data
Sep. 24, 2013 (JP) ................................. 2013-196821

(51) Int. Cl.
*H01L 29/10* (2006.01)
*H01L 29/12* (2006.01)
(Continued)

(52) U.S. Cl.
CPC ...... *H01L 29/78696* (2013.01); *H01L 29/0895* (2013.01); *H01L 29/45* (2013.01); *H01L 29/66969* (2013.01); *H01L 29/78606* (2013.01); *H01L 29/78693* (2013.01)

(58) Field of Classification Search
CPC ............ H01L 29/786; H01L 27/14692; H01L 29/78618; H01L 29/78612; H01L 29/78645; H01L 2924/13069; H01L 27/1248; H01L 27/1251; H01L 27/3248; H01L 27/3251; H01L 27/3258; H01L 27/3262; H01L 27/3272; H01L 51/0508
USPC ................... 257/43, 288, 347, 506, E29.273, 257/E29.27, E29.255; 438/99, 104
See application file for complete search history.

(56) References Cited

U.S. PATENT DOCUMENTS

| | | | |
|---|---|---|---|
| 8,829,586 B2 * | 9/2014 | Endo ................. | H01L 21/02554 257/314 |
| 2010/0032679 A1 * | 2/2010 | Kawae ................ | H01L 27/1214 257/72 |

(Continued)

FOREIGN PATENT DOCUMENTS

| | | |
|---|---|---|
| JP | 2008-218495 A | 9/2008 |
| JP | 2010-067954 A | 3/2010 |

(Continued)

*Primary Examiner* — Yuanda Zhang
*Assistant Examiner* — Sheikh Maruf
(74) *Attorney, Agent, or Firm* — Oblon, McClelland, Maier & Neustadt, L.L.P.

(57) ABSTRACT

According to one embodiment, a thin film transistor includes a first insulating film, a gate electrode, a semiconductor layer, a gate insulator film, a second insulating film, a source electrode, a tunneling insulating portion, and a drain electrode. The semiconductor layer is provided between the gate electrode and the first insulating film, and includes an amorphous oxide. The gate insulator film is provided between the semiconductor layer and the gate electrode. The second insulating film is provided between the semiconductor layer and the first insulating film. The tunneling insulating portion is provided between the semiconductor layer and the source electrode, and between the semiconductor layer and the drain electrode, and between the first insulating film and the second insulating film. The tunneling insulating portion includes oxygen and at least one selected from aluminum and magnesium. A thickness of the tunneling insulating portion is 2 nanometers or less.

12 Claims, 4 Drawing Sheets

(51) Int. Cl.
*H01L 27/12* (2006.01)
*H01L 29/786* (2006.01)
*H01L 29/66* (2006.01)
*H01L 29/45* (2006.01)
*H01L 29/08* (2006.01)

(56) References Cited

U.S. PATENT DOCUMENTS

| | | |
|---|---|---|
| 2010/0038641 A1 | 2/2010 | Imai |
| 2010/0051937 A1 | 3/2010 | Kaji et al. |
| 2010/0176379 A1* | 7/2010 | Kim ................. H01L 51/0021 257/40 |
| 2011/0114941 A1* | 5/2011 | Kato ................. G11C 16/0466 6/466 |
| 2011/0140109 A1 | 6/2011 | Yamazaki et al. |
| 2011/0180802 A1 | 7/2011 | Morosawa et al. |
| 2011/0193081 A1* | 8/2011 | Godo ................. H01L 29/7869 257/43 |
| 2012/0305913 A1* | 12/2012 | Yamazaki ......... H01L 21/02422 257/43 |
| 2013/0240878 A1 | 9/2013 | Morosawa et al. |
| 2014/0014954 A1* | 1/2014 | Godo ................. H01L 29/7869 257/43 |
| 2014/0017860 A1 | 1/2014 | Yamazaki et al. |
| 2014/0138675 A1* | 5/2014 | Yamazaki ......... H01L 29/66757 257/43 |

FOREIGN PATENT DOCUMENTS

| | | |
|---|---|---|
| JP | 2010-114413 A | 5/2010 |
| JP | 2011-142316 A | 7/2011 |
| JP | 2012-67954 | 4/2012 |
| JP | 2012-222171 A | 11/2012 |

* cited by examiner

THIN FILM TRANSISTOR AND METHOD FOR MANUFACTURING SAME

CROSS-REFERENCE TO RELATED APPLICATIONS

This application is based upon and claims the benefit of priority from Japanese Patent Application No. 2013-196821, filed on Sep. 24, 2013; the entire contents of which are incorporated herein by reference.

FIELD

Embodiments described herein relate generally to a thin film transistor and method for manufacturing same.

BACKGROUND

For example, an amorphous oxide semiconductor such as In—Ga—Zn—O or the like is used as an active layer of a thin film transistor. In such a thin film transistor, it is desirable to increase the heat resistance, the light-durability, the stability, etc.

DETAILED DESCRIPTION

Figure 1A:
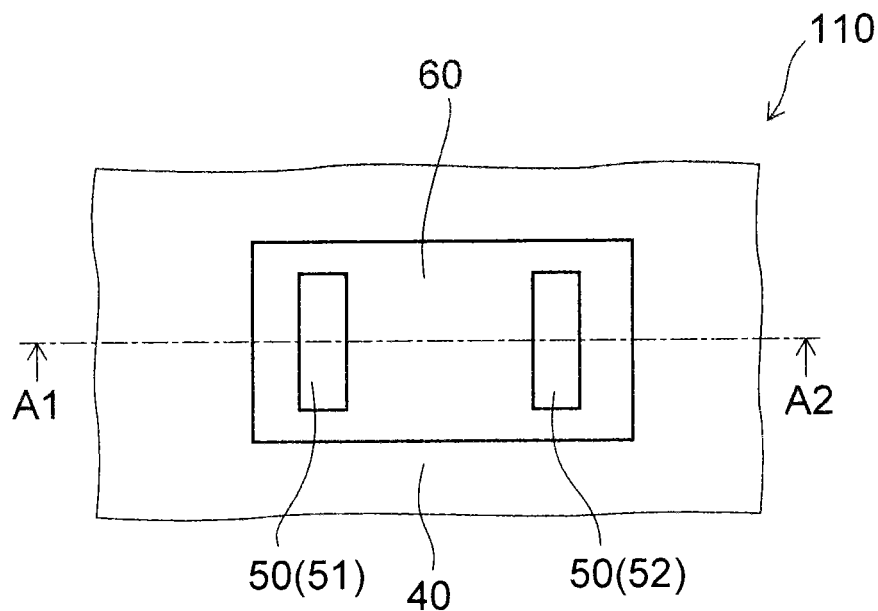
FIG. 1A and FIG. 1B are schematic views illustrating the thin film transistor according to the embodiment.

According to one embodiment, a thin film transistor includes a first insulating film, a gate electrode, a semiconductor layer, a gate insulator film, a second insulating film, a source electrode, a first tunneling insulating portion, a drain electrode, a second tunneling insulating portion, and a third tunneling insulating portion. The first insulating film is provided apart from the gate electrode in a first direction. The semiconductor layer is provided between the gate electrode and the first insulating film. The semiconductor layer includes a first portion, a second portion, and a third portion. The second portion is apart from the first portion in a second direction intersecting the first direction. The third portion is provided between the first portion and the second portion. The semiconductor layer includes an amorphous oxide. The gate insulator film is provided between the third portion and the gate electrode. The second insulating film is provided between the third portion and the first insulating film. The first tunneling insulating portion is provided between the first portion and the source electrode. The first tunneling insulating portion includes a first compound including oxygen and at least one selected from aluminum and magnesium. A thickness of the first tunneling insulating portion is 2 nanometers or less. The second tunneling insulating portion is provided between the second portion and the drain electrode. The second tunneling insulating portion includes a second compound including oxygen and at least one selected from aluminum and magnesium. A thickness of the second tunneling insulating portion is 2 nanometers or less. The third tunneling insulating portion is provided between the first insulating film and the second insulating film. The third tunneling insulating portion includes a third compound including oxygen and at least one selected from aluminum and magnesium. A thickness of the third tunneling insulating portion is 2 nanometers or less.

According to one embodiment, a method for manufacturing a thin film transistor includes forming the semiconductor layer, forming the second insulating film, and forming a tunneling insulating film. The thin film transistor includes a gate electrode, a first insulating film provided apart from the gate electrode in a first direction, a semiconductor layer provided between the gate electrode and the first insulating film, a gate insulator film, a second insulating film, a source electrode, a first tunneling insulating portion, a drain electrode, a second tunneling insulating portion, and a third tunneling insulating portion provided between the first insulating film and the second insulating film. The semiconductor layer includes a first portion, a second portion, and a third portion. The second portion is apart from the first portion in a second direction intersecting the first direction. The third portion is provided between the first portion and the second portion. The semiconductor layer includes an amorphous oxide. The gate insulator film is provided between the third portion and the gate electrode. The second insulating film is provided between the third portion and the first insulating film. The first tunneling insulating portion is provided between the first portion and the source electrode and includes a first compound including oxygen and at least one selected from aluminum and magnesium. A thickness of the first tunneling insulating portion is 2 nanometers or less. The second tunneling insulating portion is provided between the second portion and the drain electrode and includes a second compound including oxygen and at least one selected from aluminum and magnesium. A thickness of the second tunneling insulating portion is 2 nanometers or less. The third tunneling insulating portion includes a third compound including oxygen and at least one selected from aluminum and magnesium. A thickness of the third tunneling insulating portion is 2 nanometers or less. The semiconductor layer is formed on the gate insulator film. The second insulating film is formed on the semiconductor layer. The tunneling insulating film is formed on the semiconductor layer and on the second insulating film by atomic layer deposition. The tunneling insulating film serves as the first tunneling insulating portion, the second tunneling insulating portion, and the third tunneling insulating portion.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

The embodiment relates to a thin film transistor that includes an oxide semiconductor.

Figure 1B:
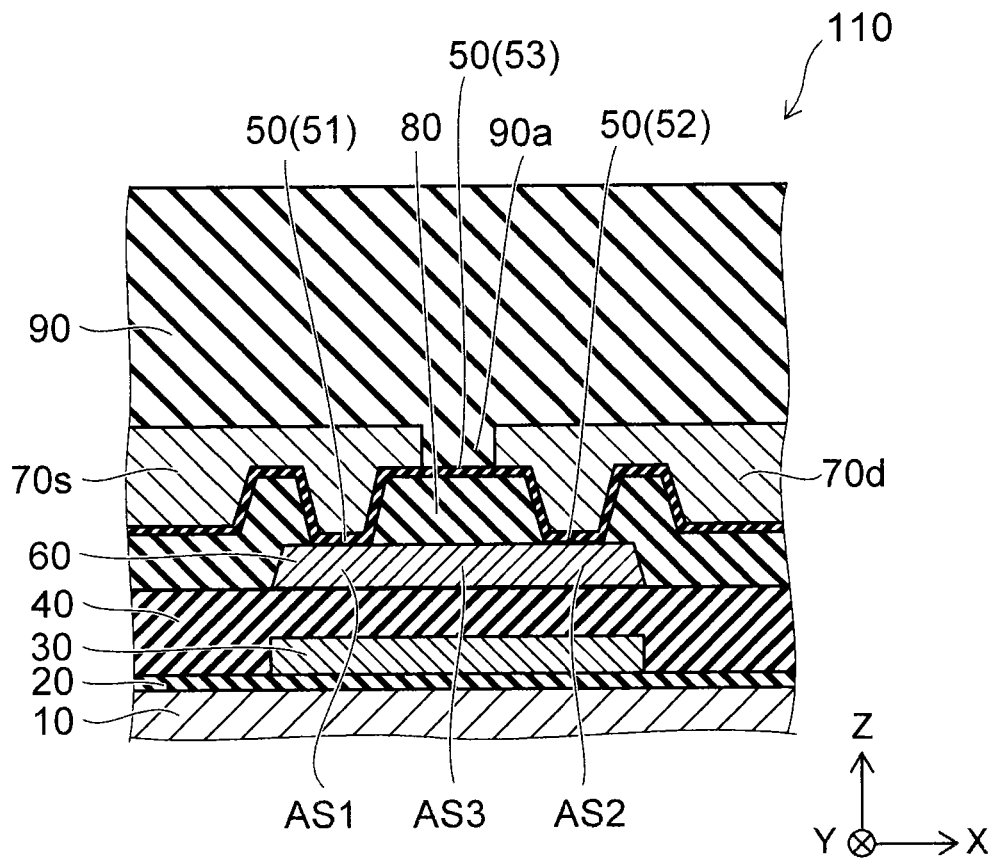

FIG. 1A and FIG. 1B are schematic views illustrating the thin film transistor according to the embodiment.

FIG. 1A is a perspective plan view showing the thin film transistor 110 according to the embodiment. In FIG. 1A, some of the components are not shown for easier viewing. FIG. 1B is a cross-sectional view along line A1-A2 of FIG. 1A.

As shown in FIG. 1A and FIG. 1B, the thin film transistor 110 according to the embodiment includes a gate electrode 30, a gate insulator film 40, a semiconductor layer 60, a tunneling insulating film 50, a source electrode 70s, and a drain electrode 70d.

In the example, an insulating layer 20 is provided on a substrate 10. The gate electrode 30, the gate insulator film 40, the semiconductor layer 60, a back-channel protection layer 80 (a second insulating film), and the tunneling insulating film 50 are provided on the insulating layer 20 in this order from the bottom. The source electrode 70s and the drain electrode 70d are provided on the tunneling insulating film 50. A passivation film 90 (a first insulating film) is provided to cover the source electrode 70s, the drain electrode 70d, and the back-channel protection layer 80.

In the example, the tunneling insulating film 50 covers a portion of the semiconductor layer 60. The tunneling insulating film 50 is, for example, an ultra-thin insulating film. The source electrode 70s and the drain electrode 70d are provided on the tunneling insulating film 50. The source electrode 70s and the drain electrode 70d are apart from each other.

The semiconductor layer 60 includes a first portion AS1 and a second portion AS2. The tunneling insulating film 50 is provided between the first portion AS1 and the source electrode 70s and between the second portion AS2 and the drain electrode 70d.

In other words, the semiconductor layer 60 includes the first portion AS1, the second portion AS2, and a third portion AS3. The third portion AS3 is provided between the first portion AS1 and the second portion AS2. The tunneling insulating film 50 includes, for example, a first tunneling insulating portion 51, a second tunneling insulating portion 52, and a third tunneling insulating portion 53.

The first tunneling insulating portion 51 is provided between the first portion AS1 and the source electrode 70s. The second tunneling insulating portion 52 is provided between the second portion AS2 and the drain electrode 70d.

The first tunneling insulating portion 51 is provided between the first portion AS1 and the source electrode 70s. The first tunneling insulating portion 51 includes a first compound. The first compound includes oxygen and at least one selected from Al (aluminum) and Mg (magnesium). The thickness of the first tunneling insulating portion 51 is, for example, 2 nm (nanometers) or less.

The second tunneling insulating portion 52 is provided between the second portion AS2 and the drain electrode 70d. The second tunneling insulating portion 52 includes a second compound. The second compound includes oxygen and at least one selected from Al and Mg. The thickness of the second tunneling insulating portion 52 is, for example, 2 nm or less.

The third tunneling insulating portion 53 is provided between the passivation film 90 and the back-channel protection layer 80. The third tunneling insulating portion 53 is provided between the passivation film 90 and the top face of the back-channel protection layer 80. The third tunneling insulating portion 53 is also provided between the passivation film 90 and the side face of the back-channel protection layer 80. The third tunneling insulating portion 53 includes a third compound. The third compound includes oxygen and at least one selected from Al and Mg. The thickness of the third tunneling insulating portion 53 is, for example, 2 nm or less.

A direction from the first portion AS1 toward the second portion AS2 is taken as an X-axis direction. One direction perpendicular to the X-axis direction is taken as a Z-axis direction. A direction that is perpendicular to the X-axis direction and the Z-axis direction is taken as a Y-axis direction.

A direction from the first portion AS1 toward the second portion AS2 is taken as a second direction (the X-axis direction). A direction intersecting the second direction is taken as a first direction. The second direction is, for example, orthogonal to the first direction. The first direction is, for example, the Z-axis direction. The gate electrode 30 is apart from the semiconductor layer 60 in the first direction. The passivation film 90 is provided apart from the gate electrode 30 in a first direction. The second portion AS2 is apart from the first portion AS1 in a second direction.

As shown in FIG. 1B, in the example, the gate electrode 30 is disposed between the third portion AS3 and the substrate 10.

For example, after the semiconductor layer 60 is formed, the back-channel protection layer 80 is formed on the semiconductor layer 60. Openings (holes) are provided in the back-channel protection layer 80 by etching. Thereby, the semiconductor layer 60 is exposed. The tunneling insulating film 50 is formed in a subsequent process. The source electrode 70s and the drain electrode 70d are provided on the tunneling insulating film 50.

Figure 2:
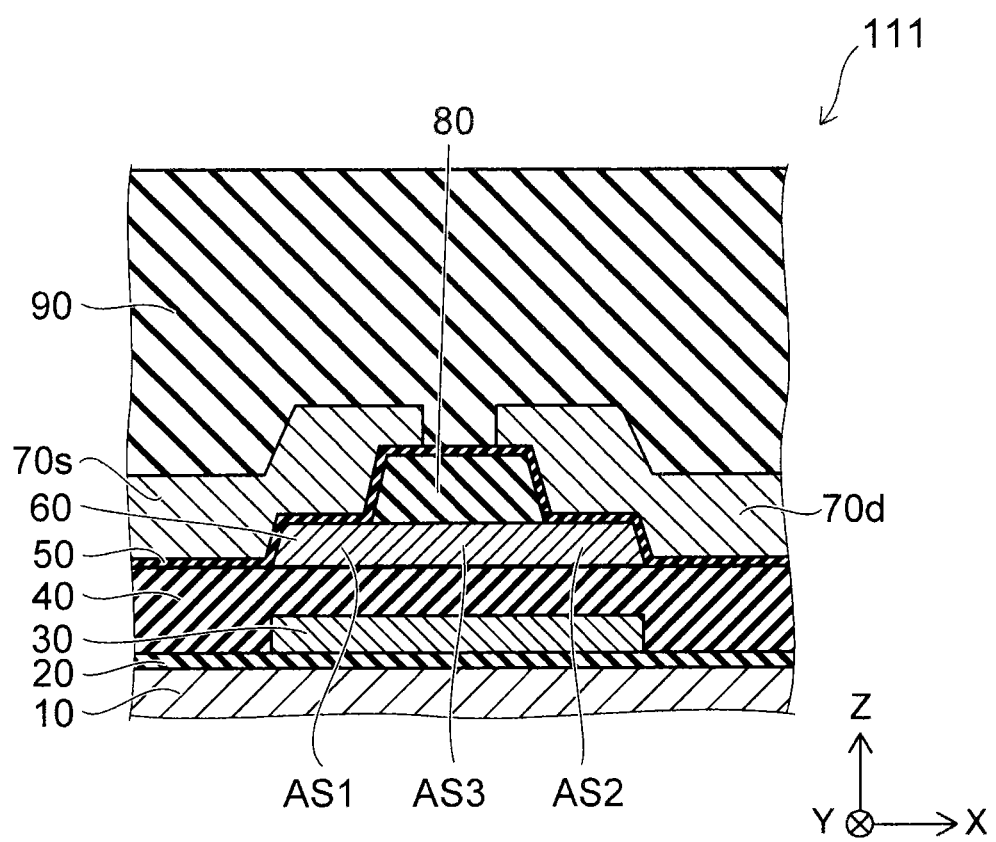
FIG. 2 is a schematic cross-sectional view illustrating the thin film transistor according to the embodiment.

FIG. 2 is a schematic cross-sectional view illustrating the thin film transistor according to the embodiment. As in the thin film transistor 112 shown in FIG. 2, the back-channel protection layer 80 that is on the gate insulator film may be removed by etching.

The passivation film 90 includes a first region 90a. The first region 90a is provided between the source electrode 70s and the drain electrode 70d. A portion (the third tunneling insulating portion 53) of the tunneling insulating film 50 is provided between the first region 90a and the back-channel protection layer 80.

For example, the substrate 10 may be capable of transmitting visible light. The substrate 10 may include a glass substrate or a plastic substrate. For example, the substrate 10 may not transmit visible light. The substrate 10 may include, for example, a substrate that does not transmit light such as silicon or stainless steel. The substrate 10 may include a base body, and an insulating layer provided on the base body.

The gate electrode 30 may include, for example, a refractory metal. The gate electrode 30 includes, for example, at least one selected from MoW, MoTa, and W. The embodiment is not limited thereto; and various conductive materials may be used as the gate electrode 30.

The gate insulator film 40 includes, for example, at least one selected from silicon oxide, silicon nitride, and silicon oxynitride. The gate insulator film 40 includes, for example, a silicon oxide film or a silicon nitride film. The gate insulator film 40 may include, for example, a stacked film including a silicon oxide film and a silicon nitride film.

The semiconductor layer 60 includes, for example, an oxide including oxygen and at least one selected from In, Ga, and Zn. The semiconductor layer 60 includes, for example, an amorphous oxide semiconductor such as In—Ga—Zn—O (hereinbelow, called IGZO), etc.

The thickness (e.g., the length in the Z-axis direction) of the semiconductor layer 60 is, for example, 5 nm or more. Thereby, for example, the electrical characteristics can be ensured. The thickness of the semiconductor layer 60 is, for example, 50 nm or less.

In the example, the tunneling insulating film 50 is formed after making contact holes in the back-channel protection layer. When a voltage is applied to the source electrode 70s and the drain electrode 70d, at least a portion of the voltage is applied to the semiconductor layer 60 via the tunneling insulating film 50. In the operations of the thin film transistor 110, the tunneling insulating film 50 functions as, for example, a tunneling layer.

The surface of the semiconductor layer 60 is, for example, flat. Thereby, for example, the operations of the thin film transistor easily become stable. For example, the arithmetic average roughness Ra of the surface (e.g., an upper surface 60u) of the semiconductor layer 60 opposing the tunneling insulating film 50 is 0.5 nm or less. The thickness of the semiconductor layer 60 is, for example, 20 nm. Thereby, the surface of the semiconductor layer 60 is flat; and, for example, the occurrence of leakage paths is suppressed in the case where the tunneling insulating film 50 is not flat.

The tunneling insulating film 50 includes, for example, an oxide film. The tunneling insulating film 50 includes, for example, at least one selected from Al and Mg.

The tunneling insulating film 50 is, for example, Al oxide. Thereby, the selectivity of the etching and the uniformity of the film properties improve. The Al oxide is, for example, an amorphous oxide. Thereby, the morphology of the tunneling insulating film 50 is good.

The tunneling insulating film 50 is formed by, for example, sputtering or ALD. The tunneling insulating film 50 is, for example, $Al_2O_3$. The tunneling insulating film 50 may be formed by forming an Al layer and subsequently oxidizing the Al layer by at least one selected from oxygen plasma oxidation and UV oxidization.

The tunneling insulating film 50 contacts the semiconductor layer 60. For example, a uniform and flat tunneling insulating film 50 is obtained easily by using ALD (atomic layer deposition). It is favorable to use ALD to form the tunneling insulating film 50.

The back-channel protection layer 80 is, for example, silicon oxide. The thickness of the back-channel protection layer 80 is, for example, thicker than the thickness of the first tunneling insulating portion 51 and thicker than the thickness of the second tunneling insulating portion 52.

The source electrode 70s and the drain electrode 70d include at least one selected from Ti, Al, Mo, Ta, and W. The source electrode 70s and the drain electrode 70d include, for example, a stacked film such as Ti/Al/Ti, Mo/Al/Mo, etc. The source electrode 70s and the drain electrode 70d may include various conductive materials such as ITO, etc. The embodiment is not limited thereto; and the source electrode 70s and the drain electrode 70d may include various conductive materials.

The passivation film 90 includes, for example, at least one selected from silicon oxide and silicon nitride. A stacked film that includes, for example, a silicon oxide film and a silicon nitride film may be used as the passivation film 90.

For example, charge (e.g., at least one selected from electrons and holes) flows toward the semiconductor layer 60 from the source electrode 70s or the drain electrode 70d. The tunneling insulating film 50 is, for example, a thin film. Thereby, the charge (e.g., the at least one selected from the electrons and the holes) is injected by, for example, tunneling.

The resistance of the tunneling insulating film 50 increases exponentially with, for example, the thickness of the tunneling insulating film 50. For example, $Al_2O_3$ is used as the tunneling insulating film 50. The resistance per area of the $Al_2O_3$ layer is about $10^5$ $\Omega um^2$ when the thickness of the $Al_2O_3$ layer is 2 nm (nanometers). The on-resistance of the thin film transistor 110 is, for example, about $10^6 \Omega$. The thickness of the tunneling insulating film 50 (the thickness of the first tunneling insulating portion 51 and the second tunneling insulating portion 52) is, for example, 2 nm or less. Thereby, the interface resistance of the tunneling insulating film 50 is, for example, not more than $\frac{1}{100}$ of the on-resistance of the thin film transistor 110.

The thickness of the first tunneling insulating portion 51 is the distance between the first portion AS1 and the source electrode 70s. The thickness of the second tunneling insulating portion 52 is the distance between the second portion AS2 and the drain electrode 70d.

The tunneling insulating film 50 suppresses, for example, the diffusion of oxygen from the semiconductor layer 60 toward the source electrode 70s and the drain electrode 70d. For example, there are cases where the oxygen diffuses from the semiconductor layer 60 toward the source electrode 70s and the drain electrode 70d when heat treatment is performed after the formation of the thin film transistor. In the embodiment, the diffusion of oxygen can be suppressed; and a thin film transistor having high heat resistance can be provided. According to the embodiment, the degradation of the light-durability of the thin film transistor due to the heat treatment can be suppressed. According to the embodiment, because the tunneling insulating film 50 has good barrier properties, a thin film transistor having high stability in the external air can be provided. According to the embodiment, a highly-stable thin film transistor that includes an oxide semiconductor can be provided.

The back-channel protection layer 80 is, for example, silicon oxide. The passivation film 90 is, for example, silicon oxide or silicon nitride. For example, the hydrogen concentration inside the back-channel protection layer 80 is lower than the hydrogen concentration inside the passivation film 90.

The concentration of hydrogen included in the back-channel protection layer 80 is, for example, not less than $1 \times 10^{19}$ $cm^{-3}$ and not more than $1 \times 10^{20}$ $cm^{-3}$. Thereby, the resistance reduction of the IGZO contacting the back-channel protection layer 80 is suppressed. The appropriate amount of hydrogen is supplied to the IGZO from the back-channel protection layer 80. Thereby, the movement of the carriers inside the semiconductor layer 60 improves. The hysteresis for the gate voltage in the operations of the thin film transistor 110 improves.

The concentration of hydrogen included in the passivation film 90 is, for example, $1 \times 10^{21}$ $cm^{-3}$ or more. The tunneling insulating film 50 (the third tunneling insulating portion 53) is provided between the back-channel protection layer 80 and the first region 90a of the passivation film 90. Thereby, the diffusion of the hydrogen from inside the passivation film 90 toward the back-channel protection layer 80 is suppressed. The diffusion of excessive hydrogen into the semiconductor layer 60 is suppressed.

The hydrogen concentration inside the back-channel protection layer 80 and the hydrogen concentration inside the passivation film 90 can be measured by, for example, SIMS (Secondary Ion Mass Spectrometry).

Figure 3A:
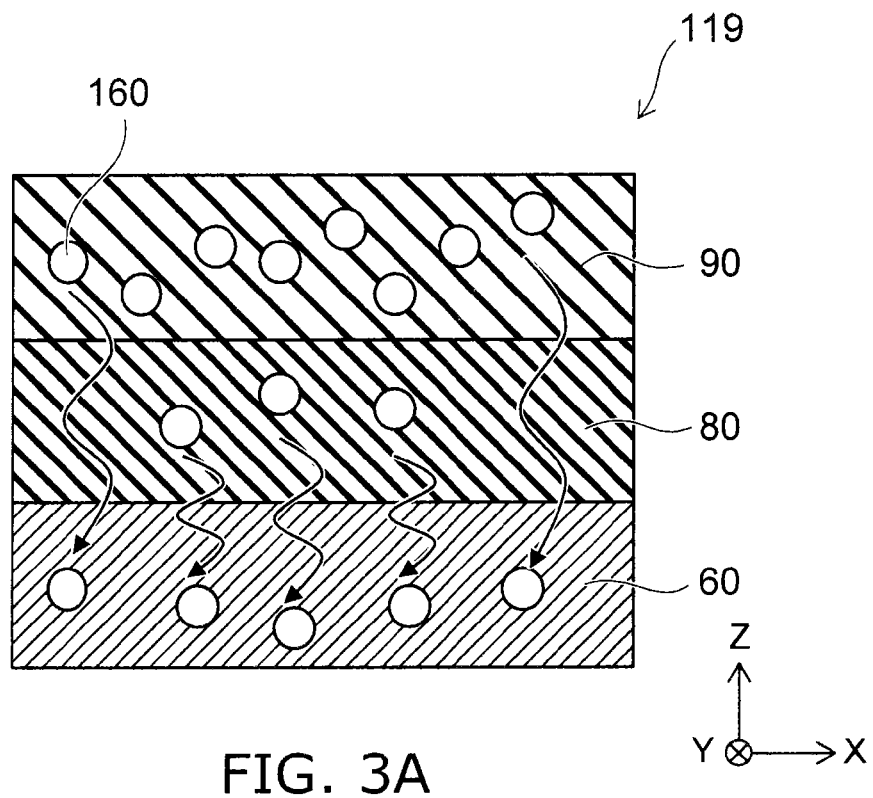
FIG. 3A and FIG. 3B are schematic views illustrating thin film transistors.
Figure 3B:
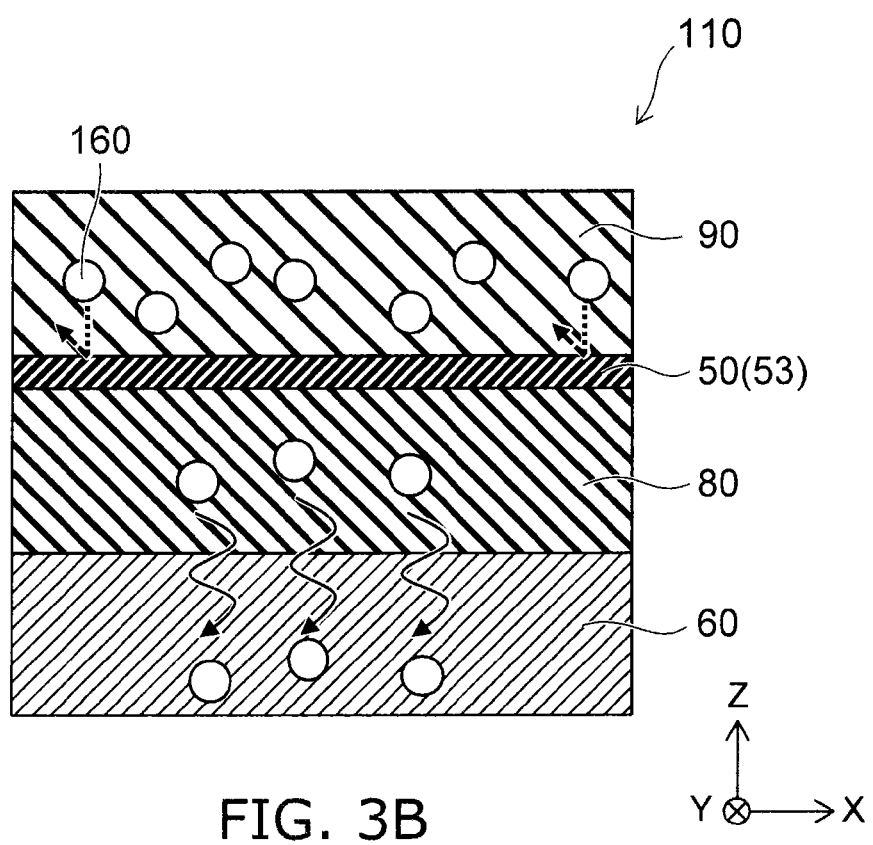

FIG. 3A and FIG. 3B are schematic views illustrating thin film transistors.

These figures show portions of thin film transistors when annealing. FIG. 3A corresponds to the thin film transistor 119 of a reference example; and FIG. 3B corresponds to the thin film transistor 110 according to the embodiment.

In the thin film transistor 119 of the reference example as shown in FIG. 3A, the tunneling insulating film 50 is not provided between the back-channel protection layer 80 and the passivation film 90. Otherwise, the thin film transistor 119 is similar to the thin film transistor 110.

In the thin film transistors 110 and 119, the back-channel protection layer 80 is provided on the semiconductor layer 60; and the passivation film 90 is provided on the back-channel protection layer 80. For example, hydrogen 160 that is included in the back-channel protection layer 80 is less than the hydrogen 160 that is included in the passivation film 90. For example, the annealing is performed after the formation of the passivation film.

In the thin film transistor 119 of the reference example as shown in FIG. 3A, the hydrogen 160 that is included in the back-channel protection layer 80 diffuses into the semiconductor layer 60 due to the annealing. For example, the hydrogen 160 that is diffused inactivates the defects inside the semiconductor layer 60. Thereby, for example, the mobility of the carriers inside the semiconductor layer 60 improves. For example, high reliability is obtained.

The hydrogen 160 that is included in the passivation film 90 diffuses into the semiconductor layer 60. The concentration of the hydrogen 160 included in the passivation film 90 is high; and the excessive hydrogen 160 diffuses into the semiconductor layer 60. Thereby, there are cases where the characteristics of the thin film transistor 119 degrade after the annealing.

On the other hand, in the thin film transistor 110, the tunneling insulating film 50 is provided between the back-channel protection layer 80 and the passivation film 90.

In such a case, as shown in FIG. 3B, the hydrogen 160 that is included in the back-channel protection layer 80 diffuses into the semiconductor layer 60 due to the annealing. On the other hand, the diffusion of the hydrogen 160 included in the passivation film 90 is suppressed by the tunneling insulating film 50. The tunneling insulating film 50 prevents the excessive hydrogen 160 included in the passivation film 90 from diffusing. The tunneling insulating film 50 functions as, for example, a barrier film that prevents the mixing of the hydrogen 160 into the semiconductor layer 60. Thereby, for example, the characteristic degradation due to the annealing can be suppressed. Because the diffusion of the excessive hydrogen 160 is suppressed, for example, high reliability is obtained.

For example, $Al_2O_3$ is used as the tunneling insulating film 50. The density of the $Al_2O_3$ is higher than the density of the silicon oxide. Thereby, for example, the impurity diffusion inside the $Al_2O_3$ is slower than the impurity diffusion inside the silicon oxide. For example, the $Al_2O_3$ functions as a diffusion prevention film (a protective film) for hydrogen and water. The $Al_2O_3$ has high stability for heat. The $Al_2O_3$ (the tunneling insulating film 50) is provided between the passivation film 90 and the back-channel protection layer 80. Thereby, the diffusion of the excessive hydrogen can be suppressed.

For example, magnesium oxide (e.g., MgO) is used as the tunneling insulating film 50. For example, MgO has high stability for heat. The degradation of the characteristics of the thin film transistor due to the annealing can be suppressed by, for example, using magnesium oxide as the tunneling insulating film 50.

According to the embodiment, the tunneling insulating film 50 is provided between the source electrode 70s and the semiconductor layer 60, between the drain electrode 70d and the semiconductor layer, and between the passivation film 90 and the back-channel protection layer 80. According to the embodiment, because the tunneling insulating film 50 has good barrier properties, a highly-stable thin film transistor that includes an oxide semiconductor can be provided.

Second Embodiment

The embodiment relates to a method for manufacturing a thin film transistor.

Figure 4:
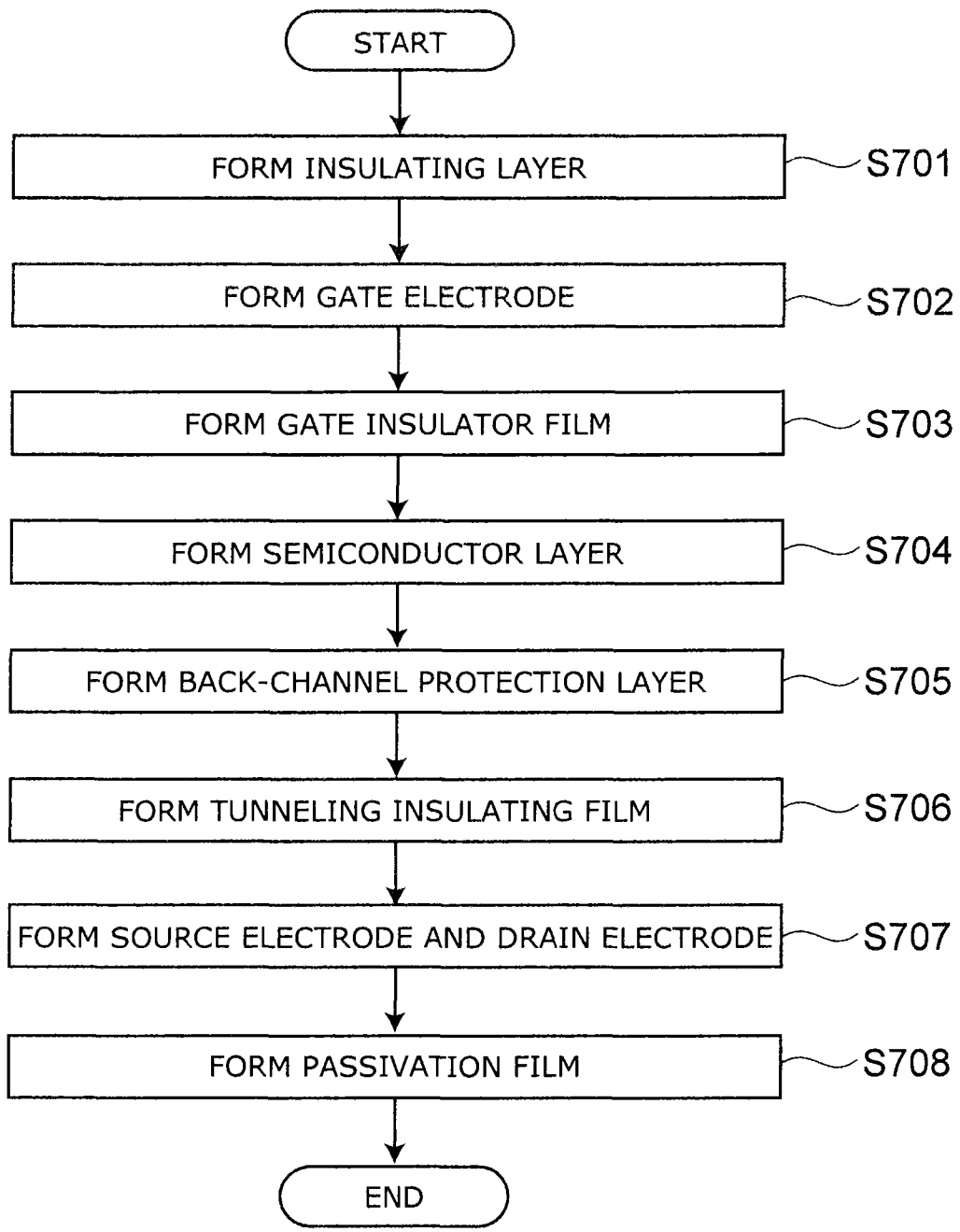
FIG. 4 is a flowchart illustrating the method for manufacturing the thin film transistor according to the embodiment.

FIG. 4 is a flowchart illustrating the method for manufacturing the thin film transistor according to the embodiment.

The manufacturing method shown in FIG. 4 includes forming an insulating layer (step S701), forming a gate electrode (step S702), forming a gate insulator film (step S703), forming a semiconductor layer (step S704), forming a back-channel protection layer (step S705), forming a tunneling insulating film (step S706), forming a source electrode and a drain electrode (step S707), and forming a passivation film (step S708).

By the manufacturing method, for example, the thin film transistor shown in FIG. 1A and FIG. 1B is manufactured. In the example as shown in FIG. 4, the tunneling insulating film is formed (step S706) after the formation of the back-channel protection layer (step S705). Subsequently, the source electrode and the drain electrode are formed (S707); and the passivation film is formed (S708). Thereby, the tunneling insulating film is formed between the source electrode 70s and the semiconductor layer 60, between the drain electrode 70d and the semiconductor layer, and between the passivation film 90 and the back-channel protection layer 80. For example, ALD or sputtering is used to form the tunneling insulating film. The tunneling insulating film 50 serves as the first tunneling insulating portion, the second tunneling insulating portion and the third tunneling insulating portion. The first tunneling insulating portion, the second tunneling insulating portion and the third tunneling insulating portion are continuous.

According to the embodiment, a method for manufacturing a highly-stable thin film transistor that includes an oxide semiconductor can be provided.

According to the embodiments, a highly-stable thin film transistor that includes an oxide semiconductor and a method for manufacturing the thin film transistor can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the thin film transistor such as the substrate, the insulating layer, the semiconductor layer, the gate insulator film, the electrode, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all thin film transistors and methods for manufacturing same practicable by an appropriate design modification by one skilled in the art based on the thin film transistors and methods for manufacturing same described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A thin film transistor, comprising:
a gate electrode;
a first insulating film provided apart form the gate electrode in a first direction;
a semiconductor layer provided between the gate electrode and the first insulating film, the semiconductor layer including a first portion, a second portion, and a third portion, the second portion being apart from the first portion in a second direction intersecting the first direction, the third portion being provided between the first portion and the second portion, the semiconductor layer including an amorphous oxide;
a gate insulator film provided between the third portion and the gate electrode;
a second insulating film provided between the third portion and the first insulating film;
a source electrode;
a first tunneling insulating portion provided between the first portion and the source electrode, the first tunneling insulating portion including a first compound including oxygen and at least one selected from aluminum and magnesium, a thickness of the first tunneling insulating portion being 2 nanometers or less;
a drain electrode;
a second tunneling insulating portion provided between the second portion and the drain electrode, the second tunneling insulating portion including a second compound including oxygen and at least one selected from aluminum and magnesium, a thickness of the second tunneling insulating portion being 2 nanometers or less; and
a third tunneling insulating portion provided between the first insulating film and the second insulating film, the third tunneling insulating portion including a third compound including oxygen and at least one selected from aluminum and magnesium, a thickness of the third tunneling insulating portion being 2 nanometers or less.

2. The thin film transistor according to claim 1, wherein a concentration of hydrogen included in the second insulating film is lower than a concentration of hydrogen included in the first insulating film.

3. The thin film transistor according to claim 1, wherein a concentration of hydrogen included in the second insulating film is not less than $1 \times 10^{19}$ cm$^{-3}$ and not more than $1 \times 10^{20}$ cm$^{-3}$.

4. The thin film transistor according to claim 1, wherein a concentration of hydrogen included in the first insulating film is $1 \times 10^{21}$ cm$^{-3}$ or more.

5. The thin film transistor according to claim 1, wherein the second insulating film includes silicon oxide.

6. The thin film transistor according to claim 1, wherein an arithmetic average roughness Ra of a surface of the first portion on the first tunneling insulating portion side is 0.5 nanometers or less.

7. The thin film transistor according to claim 1, wherein the semiconductor layer includes oxygen and at least one selected from In, Ga, and Zn.

8. The thin film transistor according to claim 1, wherein at least one selected from the first tunneling insulating portion, the second tunneling insulating portion, and the third tunneling insulating portion includes aluminum oxide.

9. The thin film transistor according to claim 1, wherein at least one selected from the first tunneling insulating portion, the second tunneling insulating portion, and the third tunneling insulating portion includes magnesium oxide.

10. The thin film transistor according to claim 1, wherein
the source electrode includes at least one selected from Ti, Al, Mo, Ta, and W, and
the drain electrode includes at least one selected from Ti, Al, Mo, Ta, and W.

11. The thin film transistor according to claim 1, wherein the gate electrode includes at least one selected from Mo, Ta, and W.

12. The thin film transistor according to claim 1, wherein the gate insulator film includes at least one selected from silicon oxide and silicon nitride.

* * * * *